United States Patent [19]

Kondo et al.

[11] Patent Number: 5,008,732
[45] Date of Patent: Apr. 16, 1991

[54] THIN FILM TWO TERMINAL ELEMENT

[75] Inventors: Hitoshi Kondo, Machida; Eiichi Ohta; Yuji Kimura, both of Yokohama, all of Japan

[73] Assignee: Ricoh Company, Ltd., Tokyo, Japan

[21] Appl. No.: 442,731

[22] Filed: Nov. 28, 1989

[30] Foreign Application Priority Data

Dec. 9, 1988 [JP] Japan .................................. 63-311391

[51] Int. Cl.$^5$ ...................... H01L 23/48; H01L 23/54
[52] U.S. Cl. ......................................... 357/71; 357/67
[58] Field of Search .................. 357/67, 2, 51, 68, 71; 350/336, 339 R, 333, 334, 339 D, 339 F

[56] References Cited

U.S. PATENT DOCUMENTS

| 4,523,811 | 6/1985 | Ota | 350/339 R |
| 4,534,623 | 8/1985 | Araki | 357/51 |
| 4,683,183 | 7/1987 | Ono | 350/334 |
| 4,842,372 | 6/1989 | Toyama | 350/339 R |
| 4,861,141 | 8/1989 | Nakazawa | 350/336 |
| 4,871,234 | 10/1989 | Susuki | 350/334 |

Primary Examiner—Rolf Hille
Assistant Examiner—S. V. Clark
Attorney, Agent, or Firm—Oblon, Spivak, McClelland, Maier & Neustadt

[57] ABSTRACT

A thin film two terminal element comprises a lower metallic electrode disposed on an insulating substrate; an insulating film disposed on the insulating substrate and formed by a hard carbon film including at least one of amorphous and microcrystal properties with carbon and hydrogen atoms as a main structure forming element; and an upper metallic electrode disposed on the insulating substrate and formed by a metal having a standard free energy in the production of an oxide at a room temperature equal to or greater than that in the production of $H_2O$ or $CO_2$. The lower metallic electrode is disposed to partially overlap a transparent electrode and is formed by a metal having a standard electrode potential in an aqueous solution equal to or higher than that of the transparent electrode.

4 Claims, 3 Drawing Sheets

THIN FILM TWO TERMINAL ELEMENT

BACKGROUND OF THE INVENTION

The present invention relates to a thin film two terminal element used in a switching element, etc., of an active matrix type liquid crystal display device, a flat panel display, etc.

A typical thin film two terminal element is an MIM element. This MIM element is typically constructed by using Ta as a lower electrode, $Ta_2O_5$(anode oxide film) as an insulating film and Cr or Cr/ITO as an upper electrode. In particular, when this MIM element is used in a switching element of the liquid crystal display device, the Cr/ITO also has a function of a picture element electrode and two layers are continuously formed. Further, a heat processing is performed at a temperature about 300° to 500° C. to obtain a symmetric property of polarity, as proposed by Japanese patent application Laying Open (KOKAI) No. 62-62333. An insulating film using $SiN_x$ by a plasma CVD method is proposed as the above insulating film in Japanese patent application Laying Open (KOKAI) No. 61-260219 and NIKKEI ELECTRONICS published on Jan. 12, 1987. In this layer structure, ITO is used as the lower electrode(picture element electrode), $SiN_x$ as the insulating film, and Cr is used as the upper electrode.

However, in the MIM element using the anode oxide film as the insulating film, the following three disadvantages are caused.

(1) The insulating film is limited to the anode oxide film of a lower metal so that it is impossible to control its matter property value and therefore arbitrarily control MIM element characteristics.

(2) It is necessary to perform the heat processing at the temperature about 300° to 500° C. so that a substrate material used in this MIM element is limited to have a high heat resistance.

(3) The dielectric constant of this element is high. Accordingly, when this element is used as the switching element of the liquid crystal display device, it is necessary to reduce the element area in consideration of the restriction in which the MIM capacity divided by the liquid crystal capacity is less than 1/10. Therefore, a high fine processing is required.

Further, in the MIM element using $SiN_x$ as the insulating film, the disadvantages of the above items (1) and (3) are solved, but the disadvantages of the item (2) are left since the film forming temperature is about 300° C. and is therefore high. Further, pin-holes tend to be caused by dust, etc., and the yield is reduced.

Further, when the above element is used as the switching element of the liquid crystal display device, there is a processing in which a photolitho-etching is performed with respect to this element after a material for the lower electrode of the two terminal element is stacked on a transparent electrode (picture element electrode). In this case, a defect in the transparent electrode is caused in a developing process in a certain case.

SUMMARY OF THE INVENTION

It is therefore a first object of the present invention to provide a thin film two terminal element for solving the above-mentioned problems and having a stability in operation for a long period.

A second object of the present invention is to provide a thin film two terminal element causing no defect in the transparent electrode.

The above objects of the present invention can be achieved by a thin film two terminal element comprising a lower metallic electrode disposed on an insulating substrate; an insulating film disposed on the insulating substrate and formed by a hard carbon film including at least one of amorphous and microcrystal properties with carbon and hydrogen atoms as a main structure forming element; and an upper metallic electrode disposed on the insulating substrate and formed by a metal having a standard free energy in the production of an oxide at a room temperature equal to or greater than that in the production of $H_2O$ or $CO_2$. The lower metallic electrode is disposed to partially overlap a transparent electrode and is formed by a metal having a standard electrode potential in an aqueous solution equal to or higher than that of the transparent electrode.

Further objects and advantages of the present invention will be apparent from the following description of the preferred embodiments of the present invention as illustrated in the accompanying drawings.

DESCRIPTION OF THE PREFERRED EMBODIMENTS

Figure 1:
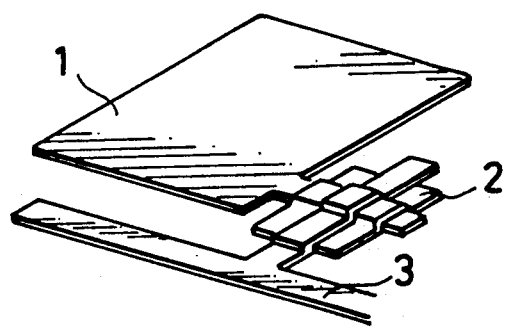
FIG. 1 is an explanatory view showing one example of a thin film two terminal element in accordance with the present invention.

The preferred embodiments of a thin film two terminal element in the present invention will next be described in detail with reference to the accompanying drawings.

The disadvantages of the conventional MIM element are caused by the material of the insulating film thereof. The inventors of this application have considered various kinds of materials for solving the above-mentioned disadvantages. As a result, we found that a hard carbon film is optimal as the insulating film and completed the present invention on the basis of a discovery of the characteristics of the upper and lower metallic electrode materials to be provided.

In the present invention, the hard carbon film has carbon and hydrogen atoms as a main structure forming element and is formed by a hard carbon film including at least one of amorphous and microcrystal properties. This film is normally called an i-C film, a diamond-shaped carbon film, a diamond film or a diamond thin film. A method for manufacturing this element and the operating characteristics are as follows.

A plasma CVD device of a plane-parallel plate type for example is used as a device for manufacturing the above element. A substrate for forming the film is first attached onto an RF electric current supplying side for promoting impact of a positive ion for self-bias. A raw material gas mixing hydrogen with a paraffinic hydrocarbon such as $CH_4$, $C_2H_6$, $C_3H_8$, or $C_4H_{10}$, etc. is introduced into such a device. A high frequency electric field having a frequency 13.56 MHz is applied between plane-parallel plate electrodes so that glow discharge is generated. As the raw material gas, it is possible to apply a mixing gas mixing hydrogen with all the hydrocarbons such as an olefinic hydrocarbon, a hydrocarbon of acetylene series, a diolefinic hydrocarbon and an aromatic hydrocarbon. By the above glow discharge, the raw material gas is resolved into a radical and an ion, and the resolved radical and ion react. Thus, a hard carbon film including at least one of an amorphous property and a microcrystal property (the microcrystal size is several ten Å to several $\mu$m) composed of a carbon atom C and a hydrogen atom H is stacked or sedimented on the substrate. A reacting condition at this time is shown in Table 1 and the operating characteristics of the hard carbon film are shown in Table 2.

TABLE 1

| RF output | 0.1 to 5.0 W/cm$^2$ |
| --- | --- |
| pressure | 10$^{-3}$ to 10 Torr |
| raw material gas | hydrocarbon/(hydrocarbon + hydrogen) = 100 to 0.5 Vol % |
| sedimentary temperature | room temperature to 950° C. |

TABLE 2

| resistivity ($\rho$) | 10$^6$ to 10$^{13}$ $\Omega$ cm |
| --- | --- |
| Vickers hardness (H) | not greater than 9500 kgmm$^{-2}$ |
| refractive index (n) | 1.9 to 2.4 |
| defective density | 10$^{17}$ to 10$^{19}$ cm$^{-3}$ |

(Note) Measuring method:

The resistivity ($\rho$) is calculated by I-V characteristics by a co-planar type cell.

The Vickers hardness (H) is calculated by a micro Vickers hardness tester.

The refractive index (n) is calculated by an ellipsometer.

The defective density is calculated by an ESR.

The dielectric constant is not greater than 5 and is therefore low.

In the hard carbon film formed as above, as a result of the analysis by an IR absorbing method and a Raman spectroscopic analyzing method, it is apparent that there exists an interatomic coupling in which the carbon atom forms a hybrid orbital of SP$^3$ and a hybrid orbital of SP$^2$. The hard carbon film is divided into that mainly including SP$^3$ and mixing SP$^2$ therewith and that mainly including SP$^2$ and mixing SP$^3$ therewith.

In the above-mentioned methods, the film resistivity and hardness values increase as an RF output is small and the pressure is low. Further, as the hydrogen mixing ratio increases, the refractive index increases and the defective density decreases so that it is possible to obtain the hard carbon film having a good quality. In the hard carbon film thus obtained and suitable for the MIM element, the occupying ratio of the SP$^3$ coupling is provided in a wide range 100 to several % and the particle diameter of the microcrystal is provided in a range several ten Å to several $\mu$m.

Further, this method has the features that the hard carbon film having a good quality can be similarly formed even in a relatively low temperature condition such as a room temperature to about 150° C. Therefore, this method is optimal to reduce the temperature in a process for manufacturing the MIM element so that the freedom of degree for selecting the substrate material used in the element is increased.

In this example, the plasma CVD method is used, but the above film having a good quality can be approximately formed similarly by an ion beam method, etc. using the same raw material gas.

Figure 2A:
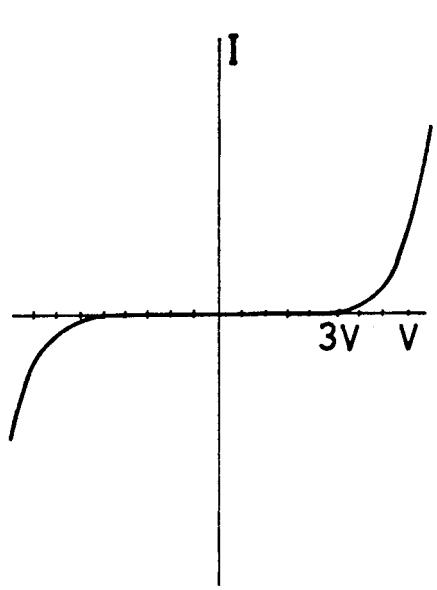
FIGS. 2a and 2b are graphs showing the electric current and voltage characteristics of the thin film two terminal element shown in FIG. 1.
Figure 2B:
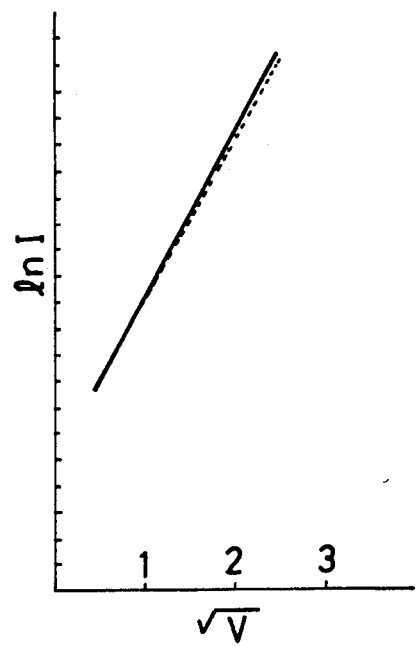

An embodiment for manufacturing the thin film two terminal element of the present invention will next be described with reference to FIG. 1. First, a conductive thin film made of Al, Ta, Ti, Cr, Ni, Cu, Au, Ag, W, Mo, Pt, Ni-Cr, etc. is formed as a lower electrode 1 on an unillustrated transparent insulating substrate by a spattering or evaporation method, etc. such that the thickness of this thin film is about 200 to 3000 Å. Thereafter, this thin film is etched to have a predetermined pattern. Next, a hard carbon film as an insulating film 2 is formed by the plasma CVD method or the ion beam method so as to normally have a thickness about 100 Å to 1 $\mu$m. Then, this hard carbon film is etched to have a predetermined pattern. A dry etching method is preferably used as this etching method. Finally, a conductive thin film as an upper electrode 3 is formed by the spattering or evaporation method, etc. so as to have a thickness about 200 to 3000 Å. Then, this thin film is etched to have a predetermined pattern. The electric current and voltage characteristics of the element thus obtained are shown in FIGS. 2a and 2b. FIGS. 2a and 2b respectively show the I-V characteristics and the lnI—$\sqrt{V}$ characteristics. As can be seen from these figures, preferable symmetric property and non-linearity characteristics are obtained. These characteristics are basically not changed by materials used in the upper and lower electrodes. However, the stability of these characteristics for a long period, concretely, the change with the passage of time with respect to a turning-on electric current value (e.g., the electric current at the applying time of 5 V) is different depending on the material of the upper electrode.

Table 3 shows a ratio (I/Io) of the turning-on electric current value to an initial value after various kinds of materials of the upper electrode are preserved for seven days, as well as a standard free energy ($\Delta$F) in the production of an oxide at the room temperature.

TABLE 3

| upper electrode material | I/Io × 100 (%) (after 7 days) | $\Delta$F ($\times$ 10$^{-3}$ KJ/kmol)* |
| --- | --- | --- |
| Al | 40 | −1580 (AlO$_3$) |
| Cr | 52 | −1060 (Cr$_2$O$_3$) |
| Ti | 60 | −890 (TiO$_2$) |
| Ni | 86 | −210 (NiO) |
| Cu | 85 | −130 (CuO) |
| Ag | 91 | 28 (Ag$_2$O$_2$) |
| Au | 88 | 78 (Au$_2$O$_3$) |
| Pt | 85 | — ** |
| | | −390 (CO$_2$) |
| | | −240 (H$_2$O) |

*The values are those described in "The newest handbook of oxides" by the Japan-Soviet communication company.
**The Pt value is considered to be equal to or greater than the Au value although there are no data of the Pt value.

In a material having a small $\Delta$F, the ratio I/Io decreases as the $\Delta$F decreases. Namely, the change with the passage of time is increased. In contrast to this, in a material having a large $\Delta$F, the ratio I/Io is approximately constant irrespective of the $\Delta$F value. A threshold value of the $\Delta$F can be considered to be approximately the $\Delta$F of CO$_2$ or H$_2$O. From this result, it is understood that the change in characteristics with the passage of time is caused by the oxidation of the upper electrode material. The water vapor in the air, an adsorbing layer on a hard carbon film surface, etc. are considered as an oxygen source. When an oxide of an upper electrode metal is stable with respect to these oxygen sources, the oxidation is proceeded so that the change in characteristics with the passage of time is considered to be caused. Accordingly, the upper electrode of the two terminal element in the present invention is formed by a metal such as Ag, Au, Cu, Ni, Pt, etc. having the standard free energy in the production of the oxide at the room temperature equal to or greater than that of $CO_2$ or $H_2O$. The lower and upper electrodes may be respectively formed by a single layer or by stacking more than two layers with each other. In this case, the upper electrode material limited in the present invention is used in a lowermost portion. i.e., a layer located just above the hard carbon film. The constructional materials above this layer are especially not limited.

Figure 3:
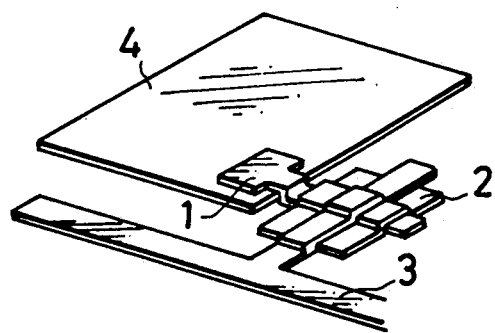
FIG. 3 is an explanatory view showing another example of the thin film two terminal element in accordance with the present invention.

FIG. 3 shows the construction of a preferable thin film two terminal element used as a switching element of a liquid crystal display device. In this construction, a lower electrode of the two terminal element is disposed such that a portion of the lower electrode overlaps a transparent electrode (picture element electrode). Next, a method for manufacturing this terminal element will be described. First, a transparent conductive thin film made of ITO, ZnO, Al, $In_2O_3$, $SnO_2$, etc. is formed as a transparent electrode 4 on an unillustrated transparent insulating substrate by the spattering and evaporation methods, etc. such that the thickness of this thin film is about 300 to 2000 Å. Then, this thin film is etched to have a predetermined pattern. Next, a conductive thin film as a lower electrode 1 is formed by the spattering and evaporation methods, etc. so as to have a thickness about 200 to 3000 Å. This thin film is then etched to have a predetermined pattern. At this time, when the conductive thin film is made of Al for example, the transparent electrode is foamed in a developing liquid at a developing time in a photolithographic process so that many holes having the size several ten μm are generated in the transparent electrode. Such a defective transparent electrode results in a defect of the display and is therefore not preferable. A local battery reaction is considered as a reason for causing the foaming of the transparent electrode. In the following description, the transparent is assumed to be ITO and the conductive thin film for the lower electrode is assumed to be Al. In this case, when the ITO is substituted for In, standard electrode potentials ($E^0$) in respective aqueous solutions are provided by the following reaction formulas.

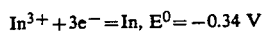

The aluminum is dissolved and the ITO is polarized until a potential at which the following reaction consuming electrons generated on the aluminum side,

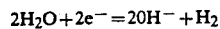

occurs. By generating the $H_2$ gas, it is considered that the ITO is foamed and eluted by a reduction reaction, thereby causing holes.

It is considered that the above reaction does not occur if the $E^0$ of the lower electrode material is approximately equal to or higher than that of the transparent electrode material. Accordingly, the lower electrode of the two terminal element in the present invention is formed by a metal having the standard electrode potential in the aqueous solution equal to or higher than that of the transparent electrode, e.g., Ni, Cu, Ag, Au, Pt, Mo, Cr, etc., when the picture element electrode is the ITO.

The lower and upper electrodes may be respectively formed by a single layer or by stacking more than two layers with each other. In this case, the lower electrode material limited in the present invention is used in a lowermost portion. i.e., a layer located just above the transparent electrode.

Embodiment 1

Figure 4A:
FIGS. 4 to 6 are views for explaining processes for manufacturing the thin film two terminal element in an embodiment of the present invention.
Figure 4B:
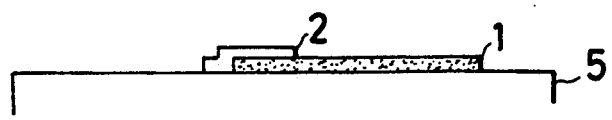
Figure 4C:

A first embodiment of the present invention will next be described on the basis of FIG. 4. An aluminum film having a thickness 1000 Å is formed by a resistance heating evaporation method on a transparent insulating substrate 5 made of plastic, glass, etc. This film is then patterned as a lower electrode 1 by the etching as shown in FIG. 4a. Next, a hard carbon film having a thickness 500 Å is formed by the plasma CVD method. This hard carbon film is then patterned as an insulating film 2 by the dry etching as shown in FIG. 4b. Next, a Pt film having a thickness 500 Å is formed by an EB evaporation method and is patterned as an upper electrode 3 by an ion beam etching as shown in FIG. 4c.

Embodiment 2

Figure 5A:
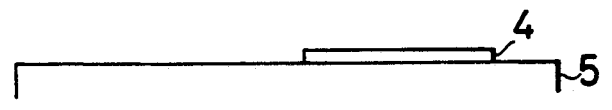
Figure 5B:
Figure 5C:
Figure 5D:
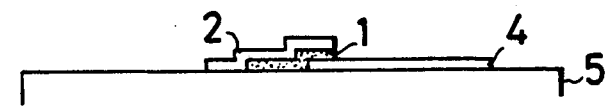
Figure 5E:
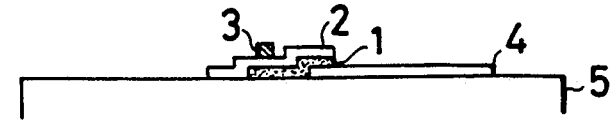

A second embodiment of the present invention will next be described on the basis of FIG. 5. An ITO film having a thickness 500 Å is formed on a transparent insulating substrate 5 made of plastic, glass, etc. by the spattering method. This film is then patterned as a transparent electrode 4 by the etching as shown in FIG. 5a. Next, an Ni film having a thickness 1000 Å is formed by the resistance heating evaporation method and is then patterned by the etching as shown in FIG. 5b. In this case, to avoid the reaction between the ITO and a hard carbon film next formed, an Ni film 1' is patterned to cover the entire face of the transparent electrode. Next, the hard carbon film having a thickness 800 Å is formed by the plasma CVD method and is then patterned as an insulating film 2 by the dry etching as shown in FIG. 5c. Further, the Ni film 1' is etched as a lower electrode 1 as shown in FIG. 5d. Finally, an Ag film having a thickness 700 Å is formed by the resistance heating evaporation method and is then patterned as an upper electrode 3 by the etching as shown in FIG. 5d.

Embodiment 3

Figure 6A:
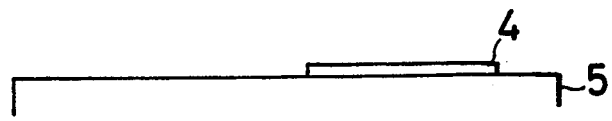
Figure 6B:
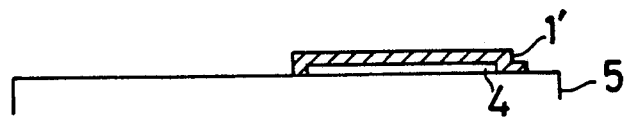
Figure 6C:
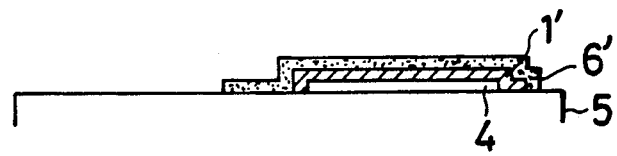
Figure 6D:
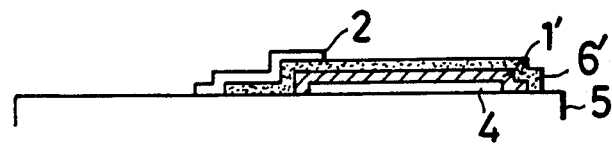
Figure 6E:
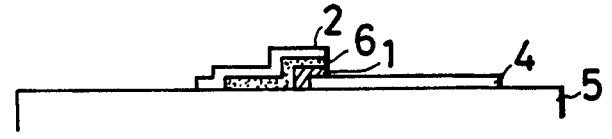
Figure 6F:
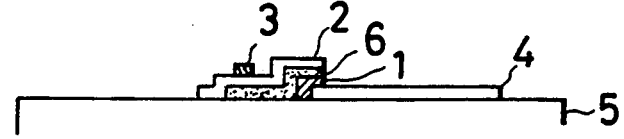

A third embodiment of the present invention will next be described on the basis of FIG. 6. An ITO film having a thickness 700 Å is formed on a transparent insulating substrate 5 made of plastic, glass, etc. by the EB evaporation method. This film is then patterned as a transparent electrode 4 by the etching as shown in FIG. 6a. Next, a Cr film 1' having a thickness 1000 Å is formed by the resistance heating evaporation method and is then patterned by the etching as shown in FIG. 6b. Next, an Al film 6' having a thickness 700 Å is formed by the resistance heating evaporation method and is then patterned by the etching as shown in FIG. 6c. Next, a hard carbon film having a thickness 800 Å is formed by the plasma CVD method and is then patterned as an insulating film 2 by the dry etching as shown in FIG. 6d. Further, the Al film 6' and the Cr film 1' are respectively etched as lower electrodes 6 and 1 as shown in FIG. 6e. Finally, a Ni film having a thickness 1000 Å is formed by the resistance heating evaporation method and is then patterned as an upper electrode 3 by the etching as shown in FIG. 6f.

All the elements manufactured in the above-mentioned embodiments have preferable nonlinearity characteristics with a good symmetric property and have a small change in characteristics with the passage of time. This change is almost canceled by performing an annealing treatment. Further, the transparent electrode is not defective so that a liquid crystal display device using this transparent electrode as a switching element has an excellent display quality.

As mentioned above, in accordance with the present invention, since the insulating film is formed by the hard carbon film, it is not necessary to dispose a manufacturing process at a high temperature and the freedom of degree for selecting the substrate material is increased. Further, the controllability of the formed film is preferable and the characteristics in operation are easily controlled and an insulating film having a low dielectric constant can be formed so that it is not necessary to reduce an element area so much. Further, the stability of the characteristics is high for a long period since the upper electrode is formed by a metal having a standard free energy in the production of an oxide at the room temperature equal to or greater than that in the production of $H_2O$ or $CO_2$.

Further, no defective transparent electrode is caused by forming the lower electrode by a metal having a standard electrode potential in an aqueous solution equal to or higher than that of the transparent electrode. Accordingly, when this transparent electrode is used as a switching element of a liquid crystal display device, the display quality becomes excellent.

Many widely different embodiments of the present invention may be constructed without departing from the spirit and scope of the present invention. It should be understood that the present invention is not limited to the specific embodiments described in the specification, except as defined in the appended claims.

What is claimed is:

1. A thin film two terminal element, comprising:
    an insulating substrate;
    a transparent electrode disposed on the insulating substrate;
    a lower metallic electrode disposed on the insulating substrate so as to partially overlap the transparent electrode and formed by a metal having a standard electrode potential in an aqueous solution equal to or higher than that of the transparent electrode;
    an insulating film disposed on the lower metallic electrode and formed by a hard carbon film including at least one of amorphous and microcrystal properties with carbon and hydrogen atoms as a main structure forming element; and
    an upper metallic electrode disposed on the insulating film and formed by a metal having a standard free energy in the production of an oxide at a room temperature equal to or greater than that in the production of $H_2O$ or $CO_2$.

2. A thin film two terminal element according to claim 1, wherein said terminal element has preferable nonlinearity characteristics in operation with a good symmetric property.

3. A thin film two terminal element according to claim 2, wherein said terminal element has a small change in characteristics in operation with the passage of time.

4. A thin film two terminal element according to claim 1, wherein said terminal element is used as a switching element of a liquid crystal display device.

* * * * *